(12) United States Patent
Suemasu et al.

(10) Patent No.: US 7,217,890 B2
(45) Date of Patent: May 15, 2007

(54) METHOD FOR FABRICATING A THROUGH-HOLE INTERCONNECTION SUBSTRATE AND A THROUGH-HOLE INTERCONNECTION SUBSTRATE

(75) Inventors: Tatsuo Suemasu, Mishima (JP); Takashi Takizawa, Kawasaki (JP)

(73) Assignee: Fujikura, Ltd., Tokyo (JP)

( * ) Notice: Subject to any disclaimer, the term of this patent is extended or adjusted under 35 U.S.C. 154(b) by 240 days.

(21) Appl. No.: 10/701,635

(22) Filed: Nov. 6, 2003

(65) Prior Publication Data

US 2004/0092117 A1 May 13, 2004

(30) Foreign Application Priority Data

Nov. 7, 2002 (JP) .......................... P2002-324135

(51) Int. Cl.
*H01R 12/04* (2006.01)

(52) U.S. Cl. ...................... 174/264; 174/260; 174/261; 174/262

(58) Field of Classification Search ................ 174/261, 174/262, 264
See application file for complete search history.

(56) References Cited

U.S. PATENT DOCUMENTS

| 5,231,751 | A | * | 8/1993 | Sachdev et al. | ............... 29/852 |
| 5,340,947 | A | * | 8/1994 | Credle et al. | ............... 174/262 |
| 6,460,247 | B1 | * | 10/2002 | Gregoire | ...................... 29/848 |
| 6,691,408 | B2 | * | 2/2004 | Biron | .......................... 29/852 |

FOREIGN PATENT DOCUMENTS

JP 2002-158191 5/2002

OTHER PUBLICATIONS

Harwley's Condensed chemical Dictionary, 14th Edition, 2002.*

* cited by examiner

*Primary Examiner*—Dean A. Reichard
*Assistant Examiner*—Yuriy Semenenko
(74) *Attorney, Agent, or Firm*—Sughrue Mion, PLLC

(57) ABSTRACT

A blind hole (3) is formed on a substrate (1) from a first side of the substrate toward a second side of the substrate (1). A conductor (11) is filled in the blind hole (3). The substrate (1) is removed from the opposite side to expose the conductor (13) filled in the blind hole (3).

15 Claims, 6 Drawing Sheets

METHOD FOR FABRICATING A THROUGH-HOLE INTERCONNECTION SUBSTRATE AND A THROUGH-HOLE INTERCONNECTION SUBSTRATE

CROSS-REFERENCE TO RELATED APPLICATION

This application claims the benefit of Japanese Patent Application P 2002-324135, filed Nov. 7, 2002 in the Japanese Patent Office, the disclosure of which is incorporated herein in its entirety by reference.

BACKGROUND OF THE INVENTION

1. Field of the Invention

The present invention relates to a method for fabricating a through-hole interconnection substrate and a through-hole interconnection substrate. More specifically, the present invention is adapted for a high-density three-dimensional packaging of stacking a silicon IC chip and the like or to a contact thereof. The present invention is also adapted for a silicon optical bench for implementing an optical device such as a laser diode, a photodiode and an optical waveguide.

According to the present invention, a metal for a conductor is filled in micro-holes for through-hole electrodes. The through hole electrodes are utilized for interconnecting wiring patterns formed on front and back surfaces of a silicon substrate, to be employed as electrodes or contacts, and to form bumps.

2. Description of the Related Art

An example of a related art technology for filling metal in micro-holes is a molten-metal suction method disclosed in Japanese Patent Laid-Open No. 2002-158191. According to this method, a molten metal is filled in the holes by means of a pressure difference. An example of a method for forming bumps on one surface of a substrate simultaneously with this filling work, is one in which metal layers are formed in the peripheries of openings of the micro-holes, followed by the metal filling by the molten-metal suction method.

In the molten-metal suction method, heat sometimes deteriorates adhesion of a heat-resistant sheet, thus making it impossible to fill the metal fully in the ends of the micro-holes.

Specifically, when the melting temperature of the metal material in use exceeds 350° C. (degrees centigrade) during the filling work, such high temperature is beyond a tolerance of the heat-resistant sheet.

SUMMARY OF THE INVENTION

In order to solve the above problems, a first aspect of the invention is directed to a method for fabricating a through-hole interconnection substrate. The method includes forming a blind hole in a substrate from a first side of the substrate toward a second side of the substrate, forming a conductor in the blind hole, and removing a portion of the substrate from the second side of the substrate to expose an end of the conductor.

The conductor may be molten and pressurized into the blind hole.

The method may include the step of forming an insulated layer on a surface of the substrate and an inner wall of the blind hole.

The substrate may be etched from the opposite side.

A second aspect of the invention is directed to a through-hole interconnection substrate. The through-hole interconnection substrate includes a substrate having a through-hole and a conductor protruding through the through-hole. The substrate is formed with a blind hole extending from a first side of the substrate toward a second side of the substrate, the conductor is formed in the blind hole by pressurizing molten conductor material, and a portion of the substrate and an end portion of the conductor are removed from the second side of the substrate, exposing the conductor filled in the blind hole.

BRIEF DESCRIPTION OF THE DRAWINGS

The above and other aspects and advantages of the invention will become more apparent by describing in detail exemplary embodiments thereof with reference to the attached drawings in which.

DETAILED DESCRIPTION OF EXEMPLARY EMBODIMENTS

Exemplary embodiments of the invention will now be described with reference to the accompanying drawings. The described exemplary embodiments are intended to assist the understanding of the invention, and are not intended to limit the scope of the invention in any way.

Figure 1:
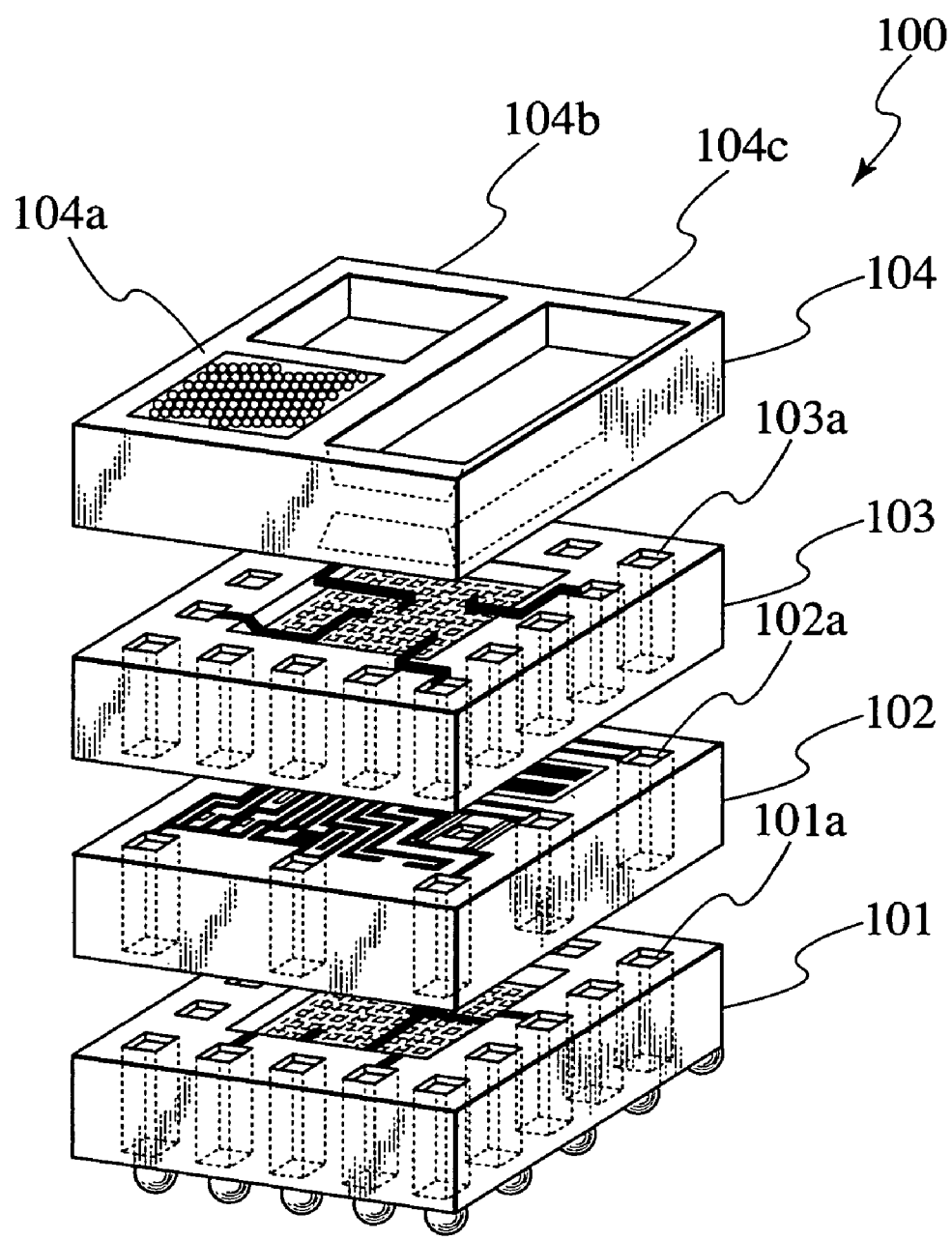
FIG. 1 is an exploded perspective view of a three-dimensional multilayer device.

Referring to FIG. 1, a multilayer device 100 includes IC (Integrated Circuit) chips 101, 102, and 103 as three stacked layers. Multilayer device 100 includes a sensor chip 104 on IC chip 103. IC chips 101, 102, and 103 include through-hole interconnections 101a, 102a, and 103a in peripheral edges thereof, respectively. Through-hole interconnections 101a, 102a and 103a electrically connect IC chips 101, 102 and 103 with each other. Sensor chip 104 includes gas sensor 104a, pressure sensor 104b, and IR sensor 104c on a surface thereof.

A method for fabricating multilayer device 100 includes the steps of processing a work, forming a circuit pattern, and bonding a wire. The work is processed as below.

Fabrication of a work or a through-hole interconnection substrate of an insulated material will be described with reference to FIGS. 2A to 2E (the case where the work is a substrate is assumed in the description below).

Figure 2A:
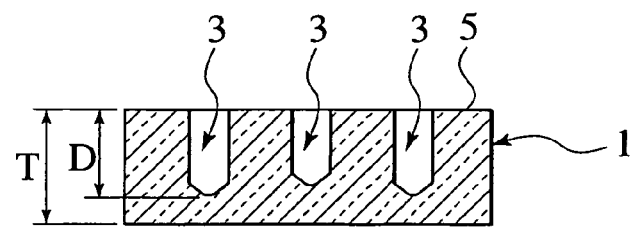
FIGS. 2A to 2E are cross-sectional views of an exemplary embodiment of an insulator substrate according to the invention, showing steps of forming through-hole interconnections.
Figure 2B:
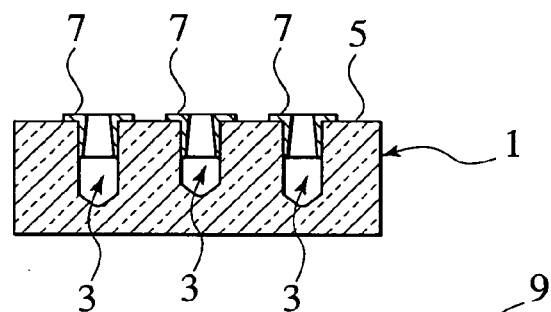
Figure 2C:
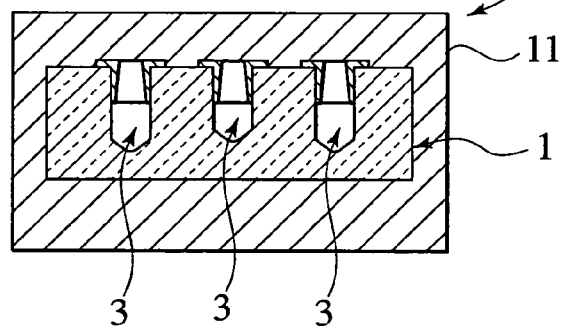
Figure 2D:
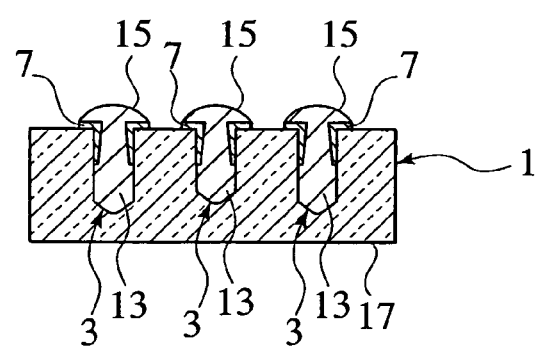

The work is fabricated by the steps of forming blind holes (refer to FIG. 2A), forming metal layers (refer to FIG. 2B), and filling molten metal (FIGS. 2C and 2D).

Referring to FIG. 2A, a plurality of micro-holes 3 are formed on one surface 5 of a glass substrate 1. Micro-holes 3 are made blind. Thickness T of glass substrate 1 is larger than depth D of each micro-hole 3 from one surface 5.

For example, a DRIE (Deep Reactive Ion Etching) method, a laser method, a micro drill method or a sandblast method may be applied to form micro-holes 3. The DRIE is an ICP-RIE (Inductively Coupled Plasma-Reactive Ion Etching) method. The laser method employs a laser for drilling. The micro drill method employs a micro drill (micro diameter drill) for drilling. In the sandblast method, micropowder is sprayed.

Additionally, the substrate is not limited to glass substrate 1. For example, a ceramic, a resin or a composite material thereof is also applicable as long as it has heat resistance higher than a melting temperature of a metal to be filled therein. The thickness of the substrate is on the order of several ten micrometers (μm) to several centimeters (cm). The diameter and depth of each micro-hole are on the order of several nanometers (nm) to several millimeters (mm). There are no limitations in the number of micro-holes to be formed on the substrate.

Referring to FIG. 2B, metal layers 7 are formed in the peripheries of openings of the plurality of micro-holes 3, for example, by sputtering, and are patterned into a predetermined shape. The shape of metal layers 7 is predetermined to assist in the formation of a bump shape (described below). An example of the metal layer (underlayer) is a layer of Cr and then Au sputtered with thicknesses of 30 nm and 500 nm, respectively. After coating photoresist thereon, the resist is patterned by photolithography. The Au and then the Cr are etched by use of the patterned resist as a mask.

Figure 5A:
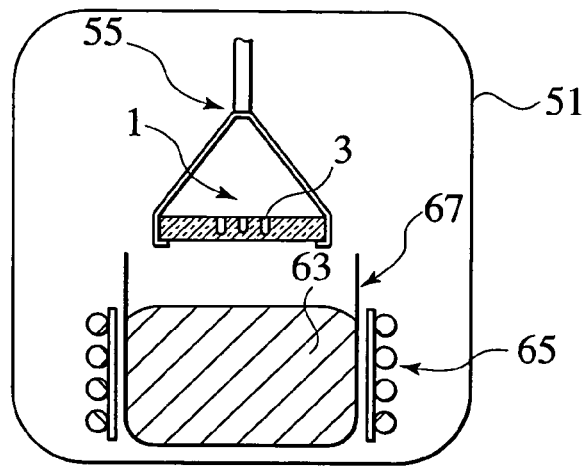
FIGS. 5A to 5C are schematic views showing steps of a molten-metal suction method.
Figure 5B:
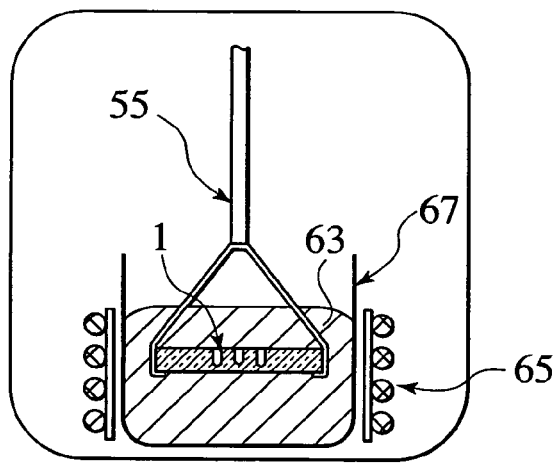
Figure 5C:
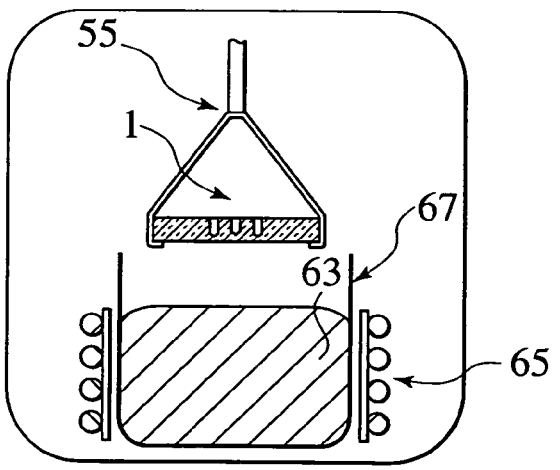

Referring to FIGS. 2C and 5A, a molten-metal bath 67 and substrate 1 are disposed in a chamber 51. Substrate 1 is supported by substrate holder 55. A molten metal 11 is stored in bath 67. Molten metal 11 is a gold-tin eutectic solder (Au—20 wt % Sn). Molten metal 11 is heated up, for example, to 330° C. to be molten by a heater 65. The atmospheric pressure in chamber 51 is reduced to vacuum. Next, referring to FIG. 5B, substrate 1 is immersed in molten metal 63 in bath 67. At this stage, molten metal 63 is not filled in micro-holes 3. Next, referring to FIG. 5C, after substrate 1 reaches a temperature substantially equal to that of molten metal 63, chamber 51 is pressurized, for example, to the atmospheric pressure or higher. This pressurization fills molten metal 63 into micro-holes 3. Subsequently, substrate 1 is raised from bath 67. At this time, bumps are formed on micro-holes 3.

Glass substrate 1 formed by the above process corresponds to FIG. 2D. Molten metal 11 has been filled and is solidified inside the plurality of micro-holes 3 of substrate 1, forming blind contacts 13. The formation of metal layers 7 also forms bumps 15.

Figure 2E:
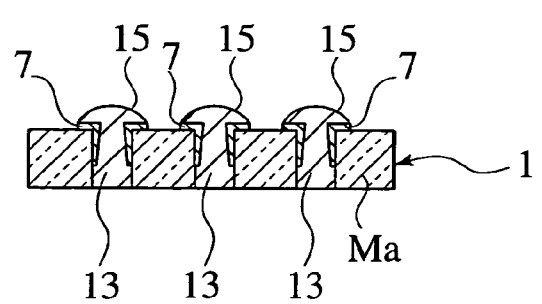

Referring to FIG. 2E, the opposite surface (bottom surface) 17 of glass substrate 1 is then ground and polished off for flattening. The grinding and polishing allow the bottom surfaces of the filled metal to appear. Thus, contacts 13 are exposed from glass material Ma. Specifically, glass substrate 1 including through-hole interconnections 13 and bumps 15 is completed.

Next, the steps of forming micro-holes in a substrate made of a material other than the insulated material will be described.

Figure 3A:
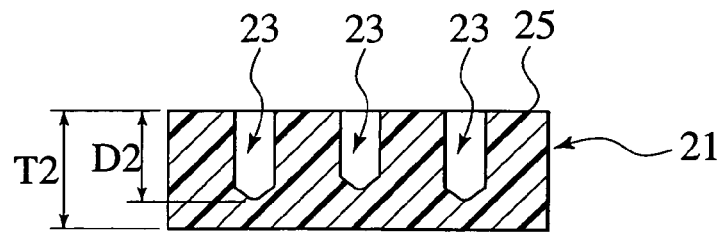
FIGS. 3A to 3D are cross-sectional views of an exemplary embodiment of a semiconductor substrate according to the invention, showing steps of forming through-hole interconnections.

Referring to FIG. 3A, a plurality of micro-holes 23 are formed on one surface 25 of a silicon substrate 21. In this case, micro-holes 23 are made blind. A thickness T2 of silicon substrate 21 is larger than a depth D2 of each micro-hole 23 from one surface 25.

To the formation of holes 23, for example, the Photo Assisted Electro-Chemical Etching (hereinafter, referred to as a PAECE method) is applied. In the PAECE, an aqueous hydrofluoric acid (HF) solution is brought into contact with the front surface of an n-type silicon substrate, and lights of a xenon lamp are irradiated onto the back surface thereof. The silicon substrate functions as an anode. A platinum plate in the aqueous hydrofluoric acid solution functions as a cathode. A voltage is applied between the silicon substrate and the platinum plate.

Figure 6A:
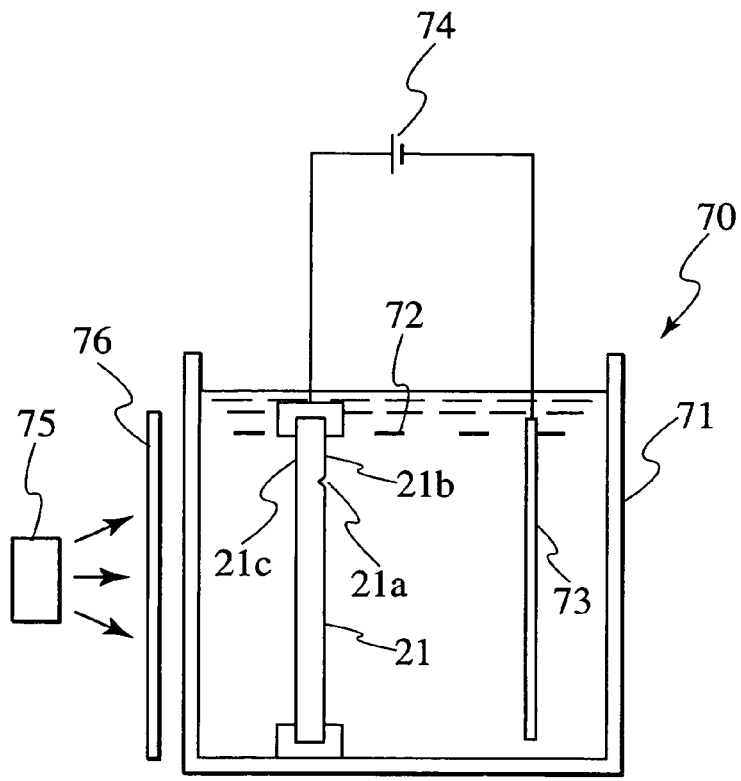
FIG. 6A is a schematic view of an apparatus for use in photo assisted electro-chemical etching.

Specifically, referring to FIG. 6A, an apparatus 70 includes electrolytic bath 71 storing electrolyte 72 of the HF solution. Apparatus 70 includes a cathode electrode 73 immersed in the electrolyte, and silicon substrate 21. Apparatus 70 includes a DC power 74 between silicon substrate 21 and cathode electrode 73. Apparatus 70 includes a light source 75 placed outside an electrolytic bath 71. Apparatus 70 includes an infrared filter 76 between electrolytic bath 71 and light source 75.

On surface 21b of the silicon substrate, a V-groove 21a is formed by use of KOH in advance. Lights are radiated from light source 75, pass through filter 76, and are irradiated onto back surface 21c of the silicon substrate, which coincides with V-groove 21a. During this irradiation, current flows between substrate 21 and electrode 73.

Figure 6B:
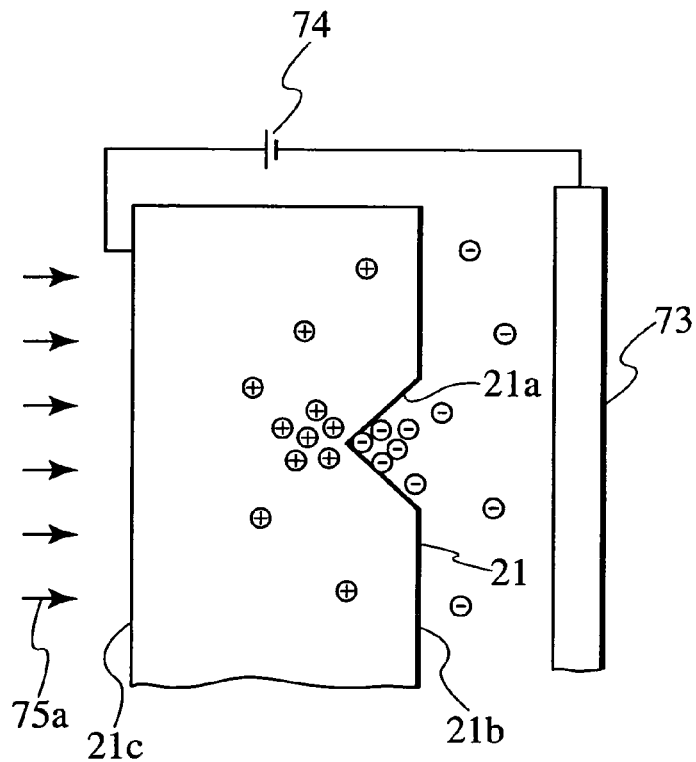
FIG. 6B is a schematic view showing a principle of the photo assisted electrochemical etching.

Referring to FIG. 6B, V-groove 21a is selectively etched to form a hole. Specifically, by the irradiation of lights 75a onto back surface 21a of the silicon substrate, carriers (positive holes) are produced on back surface 21c. These carriers concentrate on the tip end of the bottom of V-groove 21a, and the tip end is intensively etched.

The substrate is not limited to silicon substrate 21. The substrate may be made of, for example, a chemical compound, a semiconductor or a metal, as long as it has heat resistance greater than the melting temperature of the metal to be filled therein. The thickness of the substrate is the order of several ten micrometers to several centimeters. The diameter and depth of each micro-hole are the orders of several nanometers to several millimeters. There are no limitations in the number of micro-holes to be formed on the substrate.

A DRIE method, a laser method, a micro drill method or a sandblast method may be applied to a substrate of a non-insulated material in place of the PAECE method.

Figure 3B:
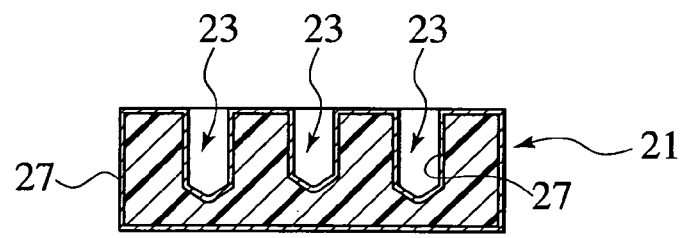

Referring to FIG. 3B, an insulated layer 27 is formed on the inner walls of micro-holes 23 and the surface of the substrate. For example, a SiO2 film, a SiN film or the like is formed by use of a method such as thermal oxidization, CVD or coating of a spin-on-glass film. The thickness of insulated layer 27 is the order of several ten nanometers to several millimeters.

Figure 3C:
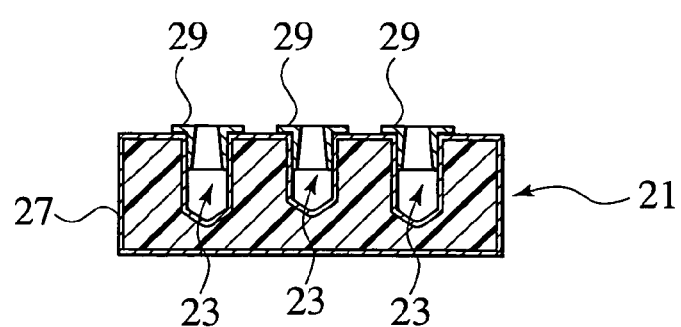

Next, referring to FIG. 3C, metal layers 29 are formed by sputtering in the peripheries of openings of micro-holes 23, and patterned into a predetermined shape. The shape of metal layers 29 is predetermined to assist in the formation of a bump shape (described below). An example of the metal layer (underlayer) is a layer of Cr and then Au sputtered with thicknesses of 30 nm and 500 nm, respectively. After coating photoresist thereon, the resist is patterned by photolithography. The Au and then the Cr are etched by use of the patterned resist as a mask.

Figure 3D:
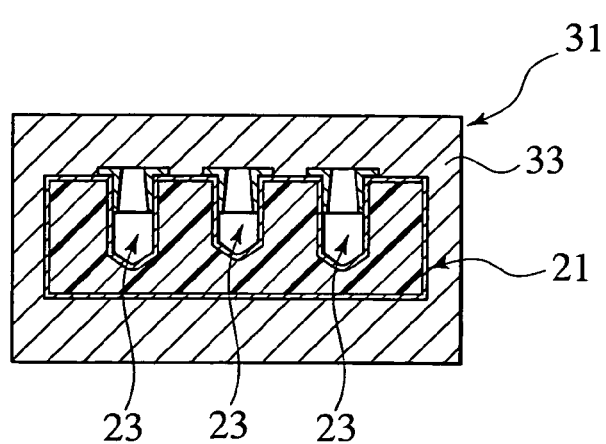

Referring to FIG. 3D, a molten metal 33 is filled in micro-holes 23 of silicon substrate 21 by the molten-metal suction method. Subsequently, substrate 21 is raised from the molten metal bath 67. At this time, bumps 37 (refer to FIG. 4A) are formed on micro-holes 23.

Figure 4A:
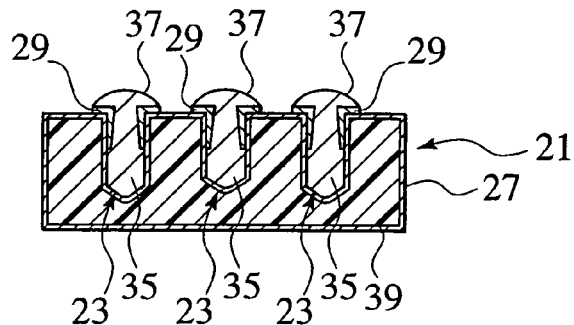
FIGS. 4A to 4E are cross-sectional views of the semiconductor substrate, showing steps following FIG. 3D.

Silicon substrate 21 after the process will be described with reference to FIG. 4A. Molten metal 33 has been filled in the plurality of micro-holes 23, and formed the plurality of contacts 35. Bumps 37 are formed on metal layers 29. As described above, the surface of silicon substrate 21 is covered with insulated layer 27.

Figure 4B:
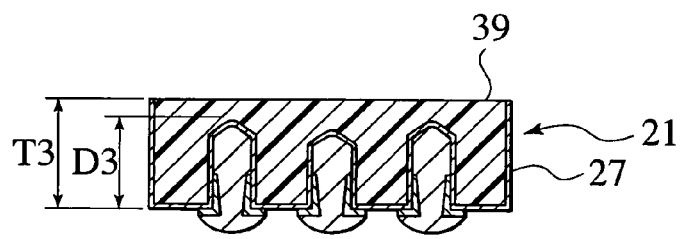

Referring to FIG. 4B, the opposite surface (bottom surface) 39 of silicon substrate 21 is ground and polished. The grinding and polishing are stopped back from insulated layer 27 formed in micro-holes 23. Thickness T3 of silicon substrate 21 is larger than depth D3 of each micro-hole 23 on which insulated layer 27 is provided and in which molten metal 33 is filled.

Figure 4C:
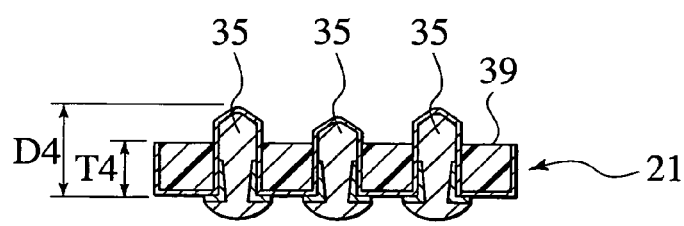

Referring to FIG. 4C, only the substrate material is etched, for example, by chemical etching. This etching allows the bottom portions of the micro-holes (that is, contacts 35 as filled metal covered with the insulated layer) to appear in the order of several micrometers. Plate thickness T4 of silicon substrate 21 is made smaller than length D4 of each contact 35. The bottom portions of the micro-holes may be exposed from the start only by, for example, the chemical etching, without grinding and polishing, other than in the method described above.

Figure 4D:
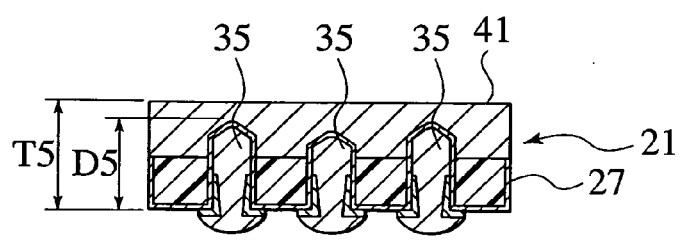

Referring to FIG. 4D, an insulated layer 41 is formed on the surface of the exposed substrate material. A process temperature during the formation of the insulated layer 41 is set at a temperature lower than a melting point of the filled metal. This set temperature prevents the filled metal from melting and falling out of micro-holes 23 during the operation. There are no limitations on the material of insulated layer 41, except that it must be possible to form insulated layer 41 at a process temperature lower than the melting point. The thickness of insulated layer 41 is the order of several micrometers to several ten micrometers.

Specifically, if the filled metal is gold-tin eutectic solder (Au—20 wt % Sn) with the melting point of 280° C., a $SiO_2$ film with a thickness of 5 μm is deposited at 200° C. by plasma CVD. Again, the opposite surface (bottom surface) 39 of the substrate is ground and polished, exposing the bottoms of the metal-filled portions. Thus, the through-hole interconnections are completed.

Figure 4E:
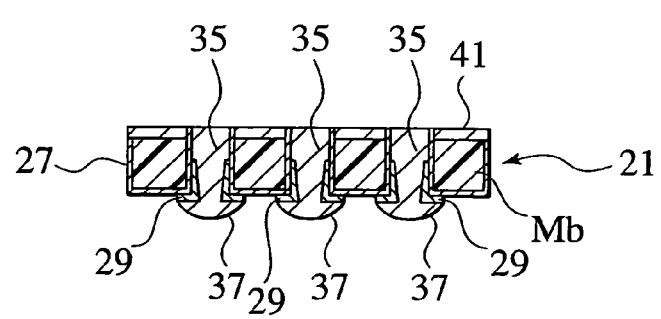

Silicon substrate 21 after the process will be described with reference to FIG. 4E. The surfaces of material Mb of silicon substrate 21 is covered with insulated layer 27 and insulated layer 41. Contacts 35 with bumps 37 made of metal layers 29 are formed. The surface of the substrate material is covered with the insulated layer, and there is no potential risk that the filled metal would contaminate the substrate material.

Thus, according to an aspect of the invention, a substrate is formed with a blind hole. Next, the inner wall of the hole and the surface of the substrate are formed with an insulated material, except in the case of a substrate formed of an insulated material. A metal layer is formed around an opening of the hole. A molten-metal suction method is employed to fill a metal in the hole and to form a bump.

Thus, according to the method, the sealing of the hole on one side by the substrate itself requires no heat-resistant sheet, and allows sealing not to be broken by heat.

In a case of a substrate of an insulated material, after filling a metal, the bottom surface is ground and polished to expose a filled metal. This completes a through-hole interconnection.

Next, in a case of a substrate without an insulated material, after filling a metal, the bottom surface is ground and polished in the same manner. However, the grinding and polishing are stopped back from the insulated layer formed in a micro-hole. Thereafter, only a substrate material is etched, using, for example, chemical etching, exposing the bottom of the micro-hole. The insulated layer at the bottom of the micro-hole is employed as a protection layer against etching. The reason not to grind and polish the filled metal in the micro-hole is to prevent the attaching or dispersing of a metal powder to or in the substrate material and the resulting contamination of the substrate. In a case of a substrate of a single crystal, for example, chemical etching after grinding and polishing can remove a fractured layer on the polished surface that is produced by grinding and polishing. This effectively removes defects such as microcracks on the surface of the substrate.

Next, an insulated layer is formed on the exposed surface of the substrate. A process temperature during the formation of the insulated layer is set at a temperature less than melting point of the filled metal. This prevents the filled metal from melting and flowing out during the operation. Thereafter, again, the bottom of the substrate is ground and polished to expose a metal filled portion. This completes a through-hole interconnection. The surface of the substrate is covered with an insulated layer, and no contamination due to the filled metal occurs.

Although the invention has been described above by reference to certain embodiments of the invention, the invention is not limited to the embodiments described above. Modifications and variations of the embodiments described above will occur to those skilled in the art, in light of the above teachings. The scope of the invention is defined with reference to the following claims.

What is claimed is:

1. A through-hole interconnection substrate comprising:
   a substrate having a through-hole;
   a metal layer formed so as to continuously cover a peripheral area of the through-hole on a first surface and a part of an inner wall of the through-hole, the metal layer having a predetermined shape on the first surface; and
   a conductor that fills the through-hole so as to have a bump on the conductor and the metal layer on the first surface, the bump having a shape in accordance with the predetermined shape of the metal layer on the first surface and being electrically connected to the conductor,
   wherein the conductor is provided in a blind hole in the substrate, and comprises a solidified pressurized molten conductor material.

2. The through-hole interconnection substrate of claim 1, wherein the metal layer is arranged between the substrate and the conductor.

3. The through-hole interconnection substrate of claim 1, further comprising a plurality of through holes.

4. The through-hole interconnection substrate of claim 1, further comprising:
   a first insulated layer on the first surface of the substrate and an inner wall of the blind hole.

5. The through-hole interconnection substrate of claim 1, further comprising:
   a second insulating layer on the second surface of the substrate.

6. The through-hole interconnection substrate of claim 1, wherein the melting temperature of the substrate is higher than the melting temperature of the conductor.

7. The through-hole interconnection substrate of claim 1, wherein: the conductor comprises first and second axial ends; the first axial end is a convex bump; and the second axial end is flat.

8. The through-hole interconnection substrate of claim 1, wherein the through hole has a constant diameter through the entire thickness of the substrate.

9. The through-hole interconnection substrate of claim 1, wherein, when the interconnection substrate is formed:
the substrate is provided with the blind hole extending from a first side of the substrate toward a second side of the substrate,
the conductor is provided in the blind hole;
a portion of the substrate and an end portion of the conductor are removed from the second side of the substrate; and
the solidified pressurized molten conductor material is exposed along the second side of the substrate.

10. The through-hole interconnect substrate of claim 1, wherein the molten conductor material is metal.

11. The through-hole interconnect substrate of claim 1, wherein the molten conductor material is a gold-tin eutectic solder.

12. A through-hole interconnect substrate comprising:
a substrate having a through-hole penetrating through the substrate from a first face thereof to a second face thereof;
a first insulating layer formed on the first face of the substrate and an inner wall of the through-hole;
a metal layer formed so as to continuously cover a peripheral area of the through-hole on the insulating layer and a part of the inner wall of the through-hole covered with the first insulating layer, the metal layer having a predetermined shape on the peripheral area;
a conductor that fills the through-hole so as to have a bump on the conductor ad the metal layer on the peripheral area, the bump having a shape in accordance with the predetermined shape of the metal layer on the peripheral area; and
a second insulating layer formed on the second face of the substrate so that a surface of the second insulating layer forms one plane along with an end portion of the conductor, the end portion opposing to the bump.

13. The through-hole interconnect substrate of claim 12, wherein the conductor comprises a solidified pressurized molten conductor material.

14. The through-hole interconnect substrate of claim 13, wherein the molten conductor material is metal.

15. The through-hole interconnect substrate of claim 13, wherein the molten conductor material is a gold-tin eutectic solder.

* * * * *